United States Patent [19]

Douglas et al.

[11] Patent Number: 5,023,465
[45] Date of Patent: Jun. 11, 1991

[54] HIGH EFFICIENCY CHARGE PUMP CIRCUIT

[75] Inventors: Kurt P. Douglas; Wen-Foo Chern, both of Boise, Id.

[73] Assignee: Micron Technology, Inc., Boise, Id.

[21] Appl. No.: 498,772

[22] Filed: Mar. 26, 1990

[51] Int. Cl.[5] .............................................. G11C 7/00
[52] U.S. Cl. ................................. 365/203; 365/189.06; 365/189.09; 307/296.2
[58] Field of Search .................... 365/189.06, 189.09, 365/226, 203, 204; 307/296.2

[56] References Cited

U.S. PATENT DOCUMENTS

| | | | |
|---|---|---|---|
| 4,404,661 | 9/1983 | Nagayama | 365/203 |
| 4,471,290 | 9/1984 | Yamaguchi | 307/296.2 |
| 4,616,143 | 10/1986 | Miyamoto | 307/264 |
| 4,689,495 | 8/1987 | Liu | 307/264 |
| 4,769,784 | 9/1988 | Doluca et al. | 365/149 |
| 4,804,870 | 2/1989 | Mahmud | 307/482 |
| 4,896,297 | 1/1990 | Miyatake et al. | 365/189.11 |
| 4,901,208 | 2/1990 | Patel | 365/189.11 |
| 4,954,731 | 9/1990 | Dhong et al. | 307/482 |

Primary Examiner—Joseph A. Popek
Attorney, Agent, or Firm—Stanley N. Protigal

[57] ABSTRACT

An integrated circuit device includes a charge pump to provide current at a potential which is greater than a supply potential. A potential maintenance circuit gates on when the potential at the output of the charge pump circuit drops to a level which is below $V_{CC}$. The potential maintenance circuit permits the charge pump can be bypassed or designed to provide a minimum current output. An overvoltage shutoff circuit permits the charge pump to be effectively bypassed when supply voltage is sufficiently high to make bypass desireable.

10 Claims, 4 Drawing Sheets

HIGH EFFICIENCY CHARGE PUMP CIRCUIT

FIELD OF THE INVENTION

This invention relates to semiconductor circuit devices and more particularly to circuitry for providing current to sense amps on semiconductor integrated circuits. The invention is particularly applicable to dynamic random access memory devices (DRAMs).

BACKGROUND OF THE INVENTION

The invention uses various materials which are electrically either conductive, insulating or semiconducting, although the completed semiconductor circuit device itself is usually referred to as a "semiconductor". One of the materials used is silicon, which is used as either single crystal silicon or as polycrystalline silicon material, referred to as polysilicon or "poly" in this disclosure.

In the operation of certain semiconductor circuit devices, it is necessary to draw up a node of the sense amp to a potential above $V_{CC}$. In the conception of the present invention, these nodes occur on iso (isolation) devices on an array of a memory device and on word lines. Memory devices which use such iso devices on an array include DRAMs (dynamic random access memories). A typical arrangement of DRAM memory cells with a sense amp is shown in FIG. 1. Other types of memory devices, such as static RAMs and video RAMs also may have similar circuit arrangements. An isolation device (iso device) is present in order to isolate a digit load from the sense amp, so that the sense amp can amplify the signal faster than if the digits were directly attached to the sense amp.

Gating an iso device with a higher potential speed read time reduces the required size of the iso device. These results are obtained because an increase in potential increases $V_{GS}$.

In a DRAM, the iso device is used with either multiplexed or non-multiplexed sense amps. In the case of multiplexed sense amps, reducing the size of the iso device allows configuring the circuit layout with the iso-devices "on pitch" (two pitch) rather than in a four pitch pattern. This simplifies layout design because the two pitch layout provides a configuration in which, for each sense amp, both iso devices are individually aligned with that sense amp. With four pitch layout patterns, more than one sense amp must be balanced as a unit.

The decrease in device width is obtained because increasing potential to gate gives the device a greater effective electrical transistor width.

In the prior art, bootstrapping had been used in order to charge nodes of a circuit to an increased potential. A typical bootstrap circuit is shown in FIG. 2. The bootstrap circuit provides an increased voltage level in response to a particular sequence, such as the receipt of a timing signal. The charge pump, on the other hand, provides a continuous output and an increased potential. The continuous high-potential output means that timing of the high-potential supply is not critical. This is particularly important when a high-potential node is used for the word line of a DRAM memory device, since the time required to select and address the word line is critical to the access speed of the DRAM.

Because the boot strap circuit is timed, individual boot strap circuits must be provided for each of several nodes, each of which receives current at the elevated potentials at different times. The charge pump, with its continuous output, can be used for supplying current to each of these nodes.

Boot strap circuits were also located at the location of the device controlled by the boot strap circuit. This was because individual boot strap circuits were dedicated to particular driven circuits in which different sequences were timed. Because the boot strap circuits were dedicated to particular driven circuits and because the boot strap circuits were timed to coincide with operation of the particular driven circuit, the amount of circuit area utilized by all of the circuitry was increased. This increase could occur despite the possibility of having smaller individual transistors in the driven circuits.

The ability to write a continuous voltage supply is particularly important in the case of word lines on DRAM devices. This is because, in DRAMs, word line addressing is particularly critical with respect to the speed of the part. Therefore, while providing a charge pump rather than a boot-strap circuit, the timing of the elevated potential output is not a condition precedent to word line access, simply because the charge pump output is not timed.

Prior art charge pumps consisted of an oscillator and capacitor. In order to prevent latchup, a clamp circuit was used in order to control current from the oscillator to one side of the capacitor. The use of an oscillator and capacitor with a single clamp circuit provided a relatively constant elevated potential, but was somewhat inefficient when compared to a boot strap circuit. It would be desirable to provide a charge pump circuit which has the relative efficiencies of a boot strap circuit but yet provides a continuous output such as is associated with a charge pump.

Prior art charge pumps use an oscillator and capacitor, along with a clamp circuit. The oscillator provides current at a supply potential to one side of the capacitor and the clamp circuit is used to charge the other side. The current supplied to the capacitor by the oscillator generates an increased potential at an output node of the circuit. This prior art circuit is shown in FIG. 3.

It is desirable to design an auxilliary circuit, so that in the event that the auxiliary circuit does not function as anticipated, the auxillary circuit can be bypassed. Specifically, during the design of an integrated circuit such as a DRAM, it is not known whether the electrical characteristics of the charge pump will exceed the limits of the circuit which receives the current from the charge pump. If the limits are exceeded, it is desirable to be able to make a small modification in the masks and thereby bypass the charge pump without sacrificing the remainder of the circuit design.

It is also likely that different product applications for integrated circuit parts may have different requirements of speed and supply voltage. If the auxilliary circuit provides a desireable function for one product application, but would make the part unsuitable for another product application, it would be desirable to be able to selectively bypass the auxilliary circuit. This would enable a single integrated circuit layout design to be used for both parts.

Ideally, an auxillary circuit should automatically respond to circuit conditions which makes the auxillary circuit unsuitable for its application. For example, a voltage boosting circuit would ideally attenuate its increased potential output or bypass itself as external system voltage becomes sufficiently high to make the use of the boosting circuit undesirable.

SUMMARY OF THE INVENTION

In accordance with the present invention, an integrated circuit device includes a charge pump to provide current at a potential which is greater than a supply potential. The current is supplied to certain nodes on the integrated circuit device in order to enhance the performance of the integrated circuit device.

When used with an integrated circuit device, such as a DRAM, the current from the charge pump may be supplied to nodes on isolation devices and nodes on word lines. This allows the nodes to be operated at an elevated potential, thereby improving the performance of the DRAM. This enhanced performance is achieved without substantially changing the circuit configuration of the DRAM array, so that, in the event that the use of the charge pump proves to be inopportune, the charge pump can be bypassed by minor changes in the masks used to produce the integrated circuit device. This configuration allows the same basic mask layout to be used in different DRAMs designed to operate under different parameters.

According to one aspect of the invention, a threshold maintenance circuit is provided which conducts currents to the nodes supplied by the charge pump when the potential at these nodes is below a predetermined potential level. This preferably includes a potential maintenance transistor connected between the charge pump's output and having a source and drain connection in a series connection between the signal level voltage source and the output node.

The threshold maintenance circuit makes it possible to alter the inventive integrated circuit to function without its charge pump by fuse repair techniques. Fuse repair techniques permit a circuit on a device to be deliberately "damaged" by either direct application of energy, such as laser cutting, or by application of an excess amount of electrical energy through connection points (pinout connections) on an integrated circuit. This removes the functionality of a part of the circuit, and bypasses that circuit. In the case of a charge pump, the fuse repair would either permit the charge pump circuitry to directly conduct supply current to the output node of the charge pump, or would permit a separate circuit to conduct to the output node in lieu of the charge pump.

According to a further aspect of the invention, a potential limiting circuit responds to potential at the charge pump's output to attenuating the output when the potential at the output node exceeds a predetermined level. In the preferred embodiment, the potential limiting circuit is responsive to a predetermined potential threshold above that of the signal level voltage source to limit the output of the oscillator.

By using the charge pump as a source of elevated potential, the circuit layout of the DRAM array is simplified and the potential boosting circuitry can be located outside of the array, on the periphery of the integrated circuit.

DETAILED DESCRIPTION OF THE PREFERRED EMBODIMENTS

Figure 1:
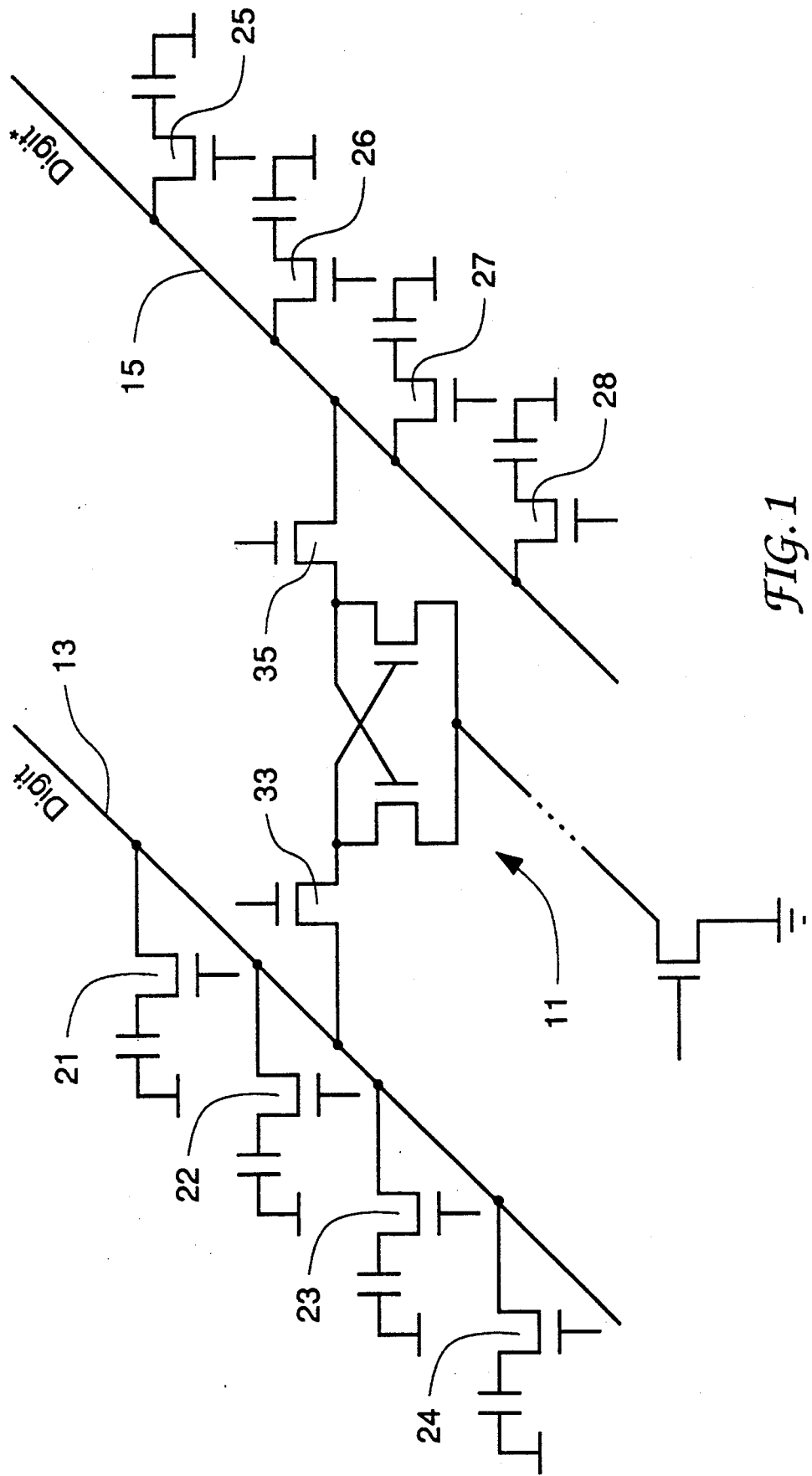
FIG. 1 shows a configuration of sense amps in a DRAM array.

Referring to FIG. 1, a sense amp 11 is connected between digit and digit* lines 13, 15 on a memory array. The digit and digit* lines 13, 15 are connected to an array of memory cells, such as cells 21-28 shown.

The memory cells 21-28 are connected to the digit and digit* lines through word lines, such as word line 31. Iso devices 33, 35 are used to gate the current between the sense amp 11 and either of the digit and digit* lines 13, 15 in order to permit the differential amp 11 to sense the relative levels of the digit and digit* lines 13, 15. By selectively gating one of the memory cells 21-28 to either the digit or the digit* lines, it is possible to detect the memory storage level in the memory cell. The memory storage level is either higher or lower than that of the unconnected digit and digit* lines, according to whether the bit represented by that level is a logical low (zero) or high (one). Hence, the sense amp 11 is a differential amplifier which senses the difference between one of the digit and digit* lines connected to a selected memory cell and the other one of the digit and digit* lines, which is not connected to a cell.

In order to increase the sensitivity of the differential amp 11 and to permit the differential amp 11 to more rapidly respond to the differential potential in the digit and digit* lines 13, 15 of the iso devices 33, 35 must have a relatively large effective transistor width. One way to accomplish this without increasing the physical size of the iso devices 33, 35 is to gate the iso devices 33, 35 at a slightly elevated potential. In other words, it is advantageous to have $V_{GS}$ greater than $V_{CC}$. Having $V_{GS}$ greater than $V_{CC}$ reduces resistance between gate and source, thereby increasing effective transistor width.

This is a trade off because smaller iso devices make sensing faster but slows down the time to fully discharge the DIGIT and DIGIT* lines to ground. Bigger iso devices allow DIGIT or DIGIT* to be written to opposite states faster. For a given desired drive ability, the iso device can be smaller if $V_{GS}$ is elevated. Furthermore, a smaller iso device is easier to design into high density circuitry.

Figure 2:
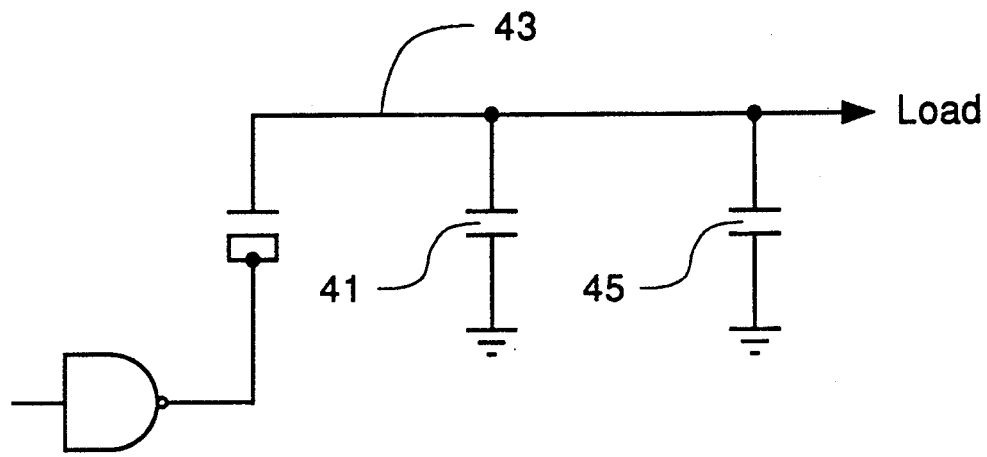
FIG. 2 (prior art) shows an equivalent circuit of the output of a bootstrap circuit.

If a bootstrap circuit is used to provide an elevated voltage, the equivalent circuit appears as shown in FIG. 2. The bootstrap circuit includes a boost capacitor 41 which provides current at an elevated potential at node 43. The node 43 has a strong capacitance, indicated at 45. This strong capacitance 45 may be unpredictable until the circuit is constructed, but is believed to stabilize the potential from the charge pump and, in effect, function as an integral part of the charge pump circuit.

Figure 3:
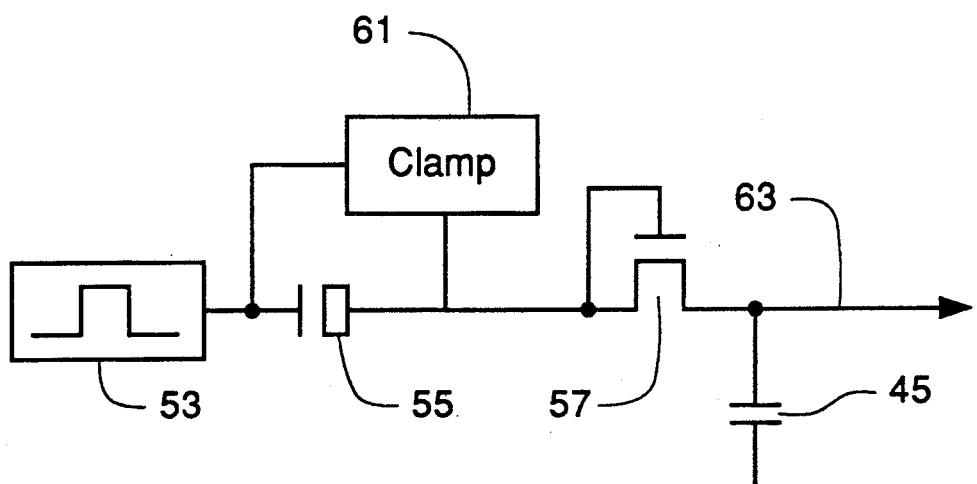
FIG. 3 (prior art) schematically shows a prior art configuration of a charge pump.

FIG. 3 shows a prior art charge pump 51. As can be seen, the charge pump consists of an oscillator 53, which provides its output to a capacitor 55 and to a diode 57. The output of the oscillator is also connected to a clamp circuit 61, which functions to provide current to an output node 63.

Figure 4:
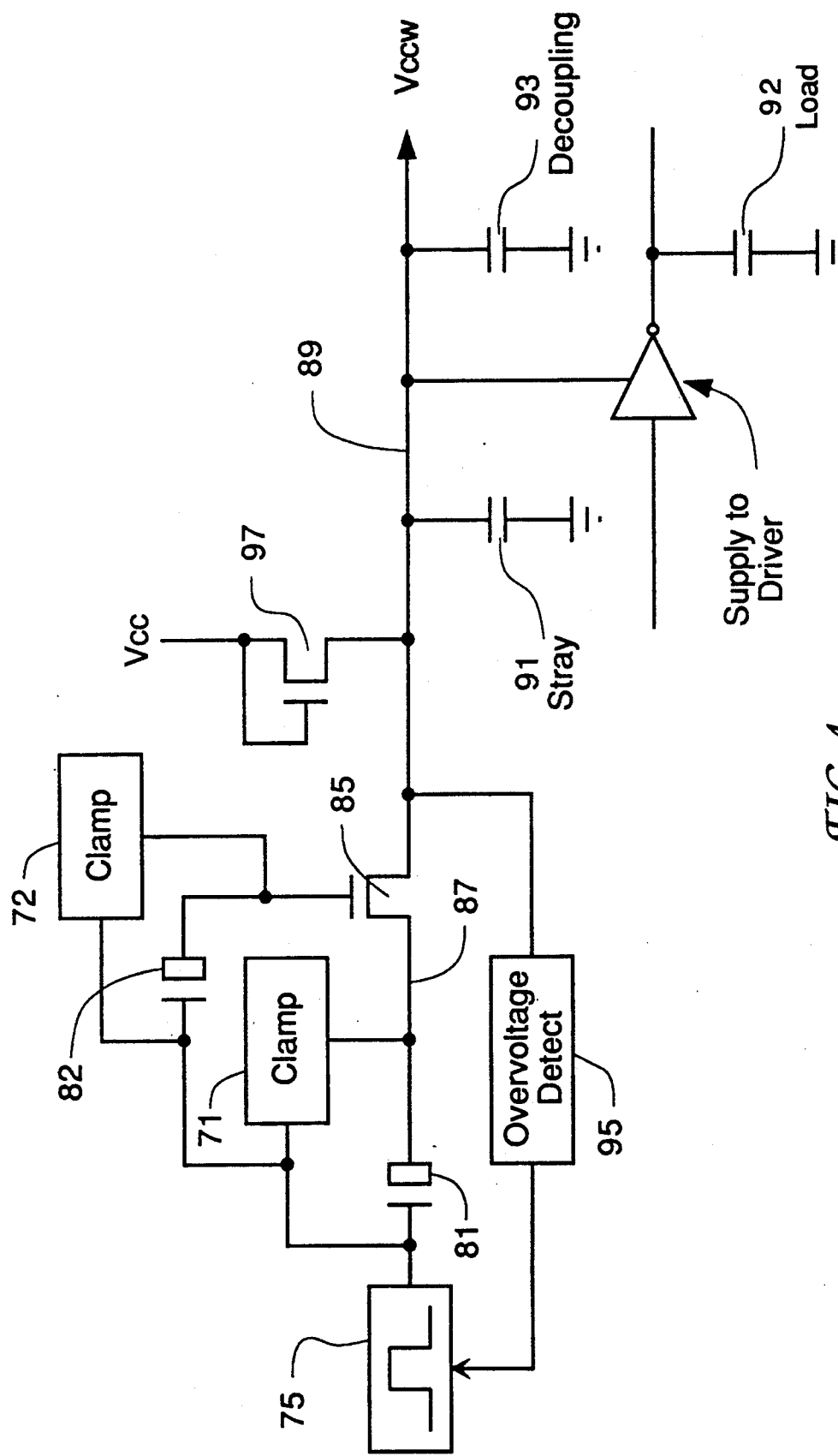
FIG. 4 is a schematic block diagram of a charge pump constructed in accordance with the present invention.
Figure 5:
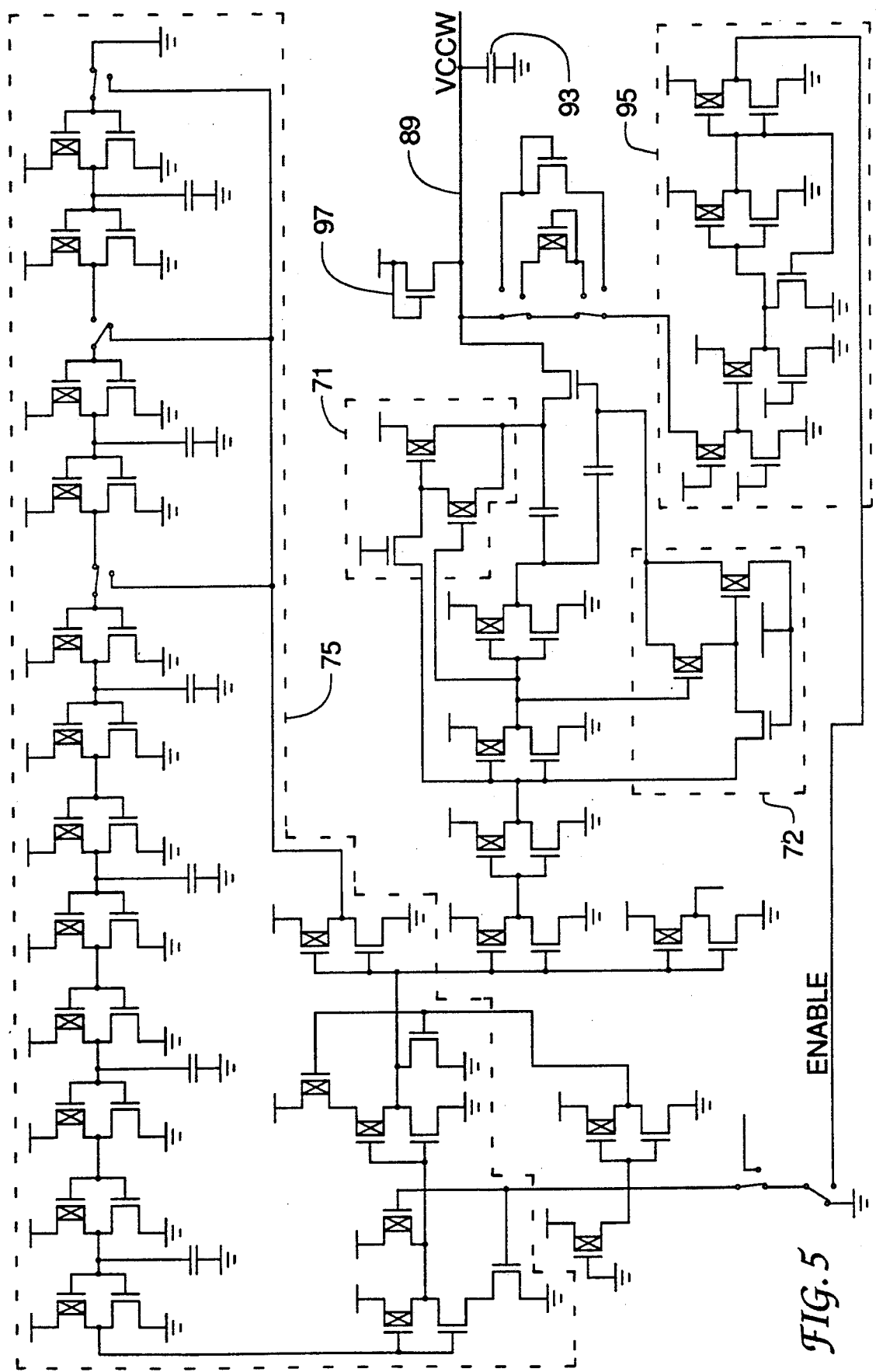
FIG. 5 schematically shows the charge pump of FIG. 4.

The inventive circuit, shown at FIGS. 4 and 5, uses two clamp circuits 71, 72. This increases the efficiency of the charge pump and thereby provides a higher potential with less power consumption. An oscillator 75 provides its output to first and second capacitors 81, 82. The clamp circuits 71, 72 are connected across the capacitors 81, 82.

The oscillator 75 is a ring oscillator which can be metal mask adjusted to increase or decrease frequency.

Instead of diode 57 (FIG. 3), an output transistor 85 is connected between node 87 of capacitors 81 and a circuit output 89 node. The circuit output is an elevated potential current source, and is identified as $V_{CCW}$. The combination of clamp circuit 72 and capacitor 82 is used to control the output of the charge pump.

Both clamp circuits 71, 72 turn on and off at the same time, but the connection of clamp circuit 72 across capacitor 82 and in series with the output transistor has the result that the operation of the second clamp circuit 72 causes the output transistor 85 to conduct when potential at the node 87 is at a high potential. The rising edge of the oscillator 75 couples a high voltage through the capacitors 81, 82 which shuts the clamps 71, 72 off and allows the nodes 87, 89 to go high. The falling edge of the output of the oscillator 75 couples a drop in potential through the capacitors 81, 82, at which point, the clamps 71, 72 turn on, preventing the nodes 87, 89 from going low.

The line capacitance at the output and the capacitance of the load, represented as 91, 92 cooperate with the switched output of capacitor 81 in order to provide a boosted potential output to the load (at 92). A decoupling capacitor 93 further cooperates with the charge pump in order to provide a steady boosted output.

An overvoltage shutoff circuit 95 is provided in order to prevent the potential at the load from exceeding a predetermined value. The overvoltage shutoff circuit 95 senses a high voltage on the output node 89. When that level goes above a certain threshold, the shutoff circuit causes the oscillator 75 to stop oscillating. After enough charge has leaked off, the pumped potential at node 89 will eventually drop after supplying the row lines and/or iso devices with charge. The overvoltage shutoff circuit 95 will then turn on the oscillator 75 and allow the oscillator 75 to run again.

In the preferred embodiment, the overvoltage shutoff circuit 95 provides an ENABLE output to the oscillator 75. The connection of the overvoltage shutoff circuit 95 to the oscillator 75 is configured an a NAND gate, thereby disabling the oscillator when the ENABLE output goes low.

On the other hand, if the potential provided by the charge pump is inadequate, a diode connected transistor 97 is used to effectively bypass the charge pump. This transistor 97 is an n channel device connected to a supply voltage node $V_{CC}$. The transistor 97 will conduct from $V_{CC}$ to node 89 as long as $V_{CCW} < (V_{CC} - V_T)$ It is off whenever $V_{CCW} > (V_{CC} - V_T)$. This portion of the circuit also helps charge up $V_{CCW}$ on power up.

We claim:

1. In a random access memory array, which includes an array of capacitor cells corresponding to memory address locations, at least one signal line which is precharged to signal sensing levels, a circuit for providing signals corresponding to signal levels in the capacitor cells to the signal lines, a signal level voltage source, and a precharge circuit which precharges the signal line, the random access memory array comprising:

(a) the precharge circuit including an oscillator providing an oscillating output, a capacitor connected at the oscillating output and a switching circuit connected across the capacitor and responsive to the oscillating output, the precharge circuit providing an elevated potential output at an output node; and (b) a potential limiting circuit responsive to potential at the output node, the potential limiting circuit attenuating the output of the precharge circuit when the output node reaches a predetermined potential, thereby limiting the potential at the output node.

2. The random access memory array described in claim 1, further comprising:

a potential maintenance transistor having a source and drain connection in a series connection between the signal level voltage source and the output node, and the potential maintenance transistor being connected with its gate to the signal level voltage source.

3. The random access memory array described in claim 1, further comprising:

the potential limiting circuit being responsive to a predetermined potential threshold above that of the signal level voltage source to limit the output of the oscillator.

4. The random access memory array described in claim 1, further comprising:

a) the precharge circuit including a ring oscillator providing said oscillating output, the ring oscillator including a plurality of amplifiers generating alternating logic states; and b) the potential limiting circuit limiting the output of the oscillator by holding an output of one portion of the ring oscillator to a predetermined logic state when the predetermined potential threshold is sensed by the potential limiting circuit.

5. The random access memory array described in claim 1, further comprising:

the precharge circuit including a ring oscillator providing said oscillating output.

6. In a random access memory array, which includes an array of capacitor cells corresponding to memory address locations, at least one signal line which is precharged to signal sensing levels, a circuit for providing signals corresponding to signal levels in the capacitor cells to the signal lines, a signal level voltage source, and a precharge circuit which precharges the signal line, the random access memory array comprising:

a) the precharge circuit providing an elevated potential output at an output node; and b) means to maintain the output node at a predetermined minimum potential by conducting current from the signal level voltage source, said means including a potential maintenance transistor connected to conduct from the signal level voltage source at times when potential at the output node falls below a predetermined potential with respect to the potential of the output node and to present an open circuit when potential at the output node is greater than the potential of the signal level voltage source.

7. The random access memory array described in claim 6, further comprising:

the potential maintenance transistor having a source and drain connection in a series connection between the signal level voltage source and the output node, and the potential maintenance transistor being connected with its gate to the signal level voltage source.

8. The random access memory array described in claim 7, further comprising:
   a potential limiting circuit responsive to potential at an output node, the potential limiting circuit attenuating the output of the precharge circuit to limit the potential at the output node.

9. In a random access memory array, which includes an array of capacitor cells corresponding to memory address locations, at least one signal line which is precharged to signal sensing levels, a circuit for providing signals corresponding to signal levels in the capacitor cells to the signal lines, a signal level voltage source, and a precharge circuit which precharges the signal line, random access memory array comprising:
   a) the precharge circuit providing an elevated potential output at an output node; and
   b) a potential limiting circuit responsive to potential at the output node, the potential limiting circuit attenuating the output of the precharge circuit when the output node reaches a predetermined potential, thereby limiting the potential at the output node.

10. The random access memory array described in claim 9, further comprising:
   a) the precharge circuit including an oscillator providing an oscillating output and a circuit which provides said elevated potential output in response to the oscillating output;
   b) the potential limiting circuit being responsive to a predetermined potential threshold above that of the signal level voltage source to limit the output of the oscillator.

* * * * *

UNITED STATES PATENT AND TRADEMARK OFFICE
CERTIFICATE OF CORRECTION

PATENT NO. : 5,023,465

DATED : June 11, 1991

INVENTOR(S) : Kurt P. Douglas, et al

It is certified that error appears in the above-identified patent and that said Letters Patent is hereby corrected as shown below:

On the title page:

In the Abstract, line 4, delete "on" and insert -- ON --;

In the Abstract, line 6-8, delete "permits the charge pump can be bypassed or designed to provide a minimum current output" and insert -- is designed to permit the charge pump to be bypassed or to provide a minimum current output --.

Signed and Sealed this

Twenty-third Day of November, 1993

Attest:

BRUCE LEHMAN

Attesting Officer

Commissioner of Patents and Trademarks